United States Patent [19]

Glavish et al.

[11] Patent Number: 5,438,203
[45] Date of Patent: Aug. 1, 1995

[54] SYSTEM AND METHOD FOR UNIPOLAR MAGNETIC SCANNING OF HEAVY ION BEAMS

[75] Inventors: Hilton F. Glavish, Incline Village, Nev.; Michael A. Guerra, late of Exeter, N.H., by Sarah B. Cutler, executor; Tadashi Kawai, Kyoto, Japan; Masao Naito, Kyoto, Japan; Nobuo Nagai, Kyoto, Japan

[73] Assignee: Nissin Electric Company, Kyoto, Japan

[21] Appl. No.: 257,989

[22] Filed: Jun. 10, 1994

[51] Int. Cl.⁶ .................................. H01J 37/141
[52] U.S. Cl. ..................... 250/396 ML; 250/398; 250/492.21
[58] Field of Search ........... 250/396 ML, 398, 492.21, 250/492.3, 396 R; 335/210, 213

[56] References Cited

U.S. PATENT DOCUMENTS

| | | |
|---|---|---|
| 2,053,537 | 9/1936 | Schlesinger . |
| 2,108,091 | 2/1938 | Von Ardenne . |
| 2,260,725 | 10/1941 | Richards et al. . |
| 3,193,717 | 7/1965 | Nunan . |
| 3,569,757 | 3/1971 | Brewer et al. . |
| 3,911,321 | 10/1975 | Wardly .................... 250/396 ML |
| 4,063,098 | 12/1977 | Enge . |
| 4,260,897 | 4/1981 | Bakker et al. . |
| 4,276,477 | 6/1981 | Enge . |
| 4,367,411 | 1/1983 | Hanley et al. ............... 250/396 ML |
| 4,469,948 | 9/1984 | Veneklasen et al. . |
| 4,687,936 | 8/1987 | McIntyre et al. . |
| 4,745,281 | 5/1988 | Enge . |
| 4,804,852 | 2/1989 | Rose et al. . |
| 4,806,766 | 2/1989 | Chisholm .................. 250/396 ML |
| 5,012,104 | 4/1991 | Young . |
| 5,053,627 | 10/1991 | Ruffell et al. . |
| 5,132,544 | 7/1992 | Glavish .................... 250/492.21 |
| 5,311,028 | 5/1994 | Glavish .................... 250/492.21 |

FOREIGN PATENT DOCUMENTS 62-88246A 4/1987 Japan .

OTHER PUBLICATIONS

H. F. Glavish et al., "Fast Magnetic Scanning and Ion Optical Features of the New Ibis Oxygen Implanter," Nucl. Instr. & Methods, vol. B74, pp. 397-400 (1993).

*Primary Examiner*—Jack I. Berman
*Assistant Examiner*—James Beyer
*Attorney, Agent, or Firm*—Fish & Richardson

[57] ABSTRACT

A magnetic deflection system for scanning an ion beam over a selected surface comprising: a magnetic structure having poles with respective scanning coils and respective pole faces that define therebetween a gap through which the ion beam passes; a primary current source coupled to the scanning coils adapted to apply to the scanning coils an excitation current to generate a substantially unipolar oscillatory magnetic field in the gap that alternates in polarity as a function of time to cause scanning of the ion beam, the substantially unipolar magnetic field having a magnitude sufficiently greater than zero to prevent the transverse cross-section of the ion beam from substantially fluctuating in size while the ion beam is being scanned across the selected surface.

22 Claims, 7 Drawing Sheets

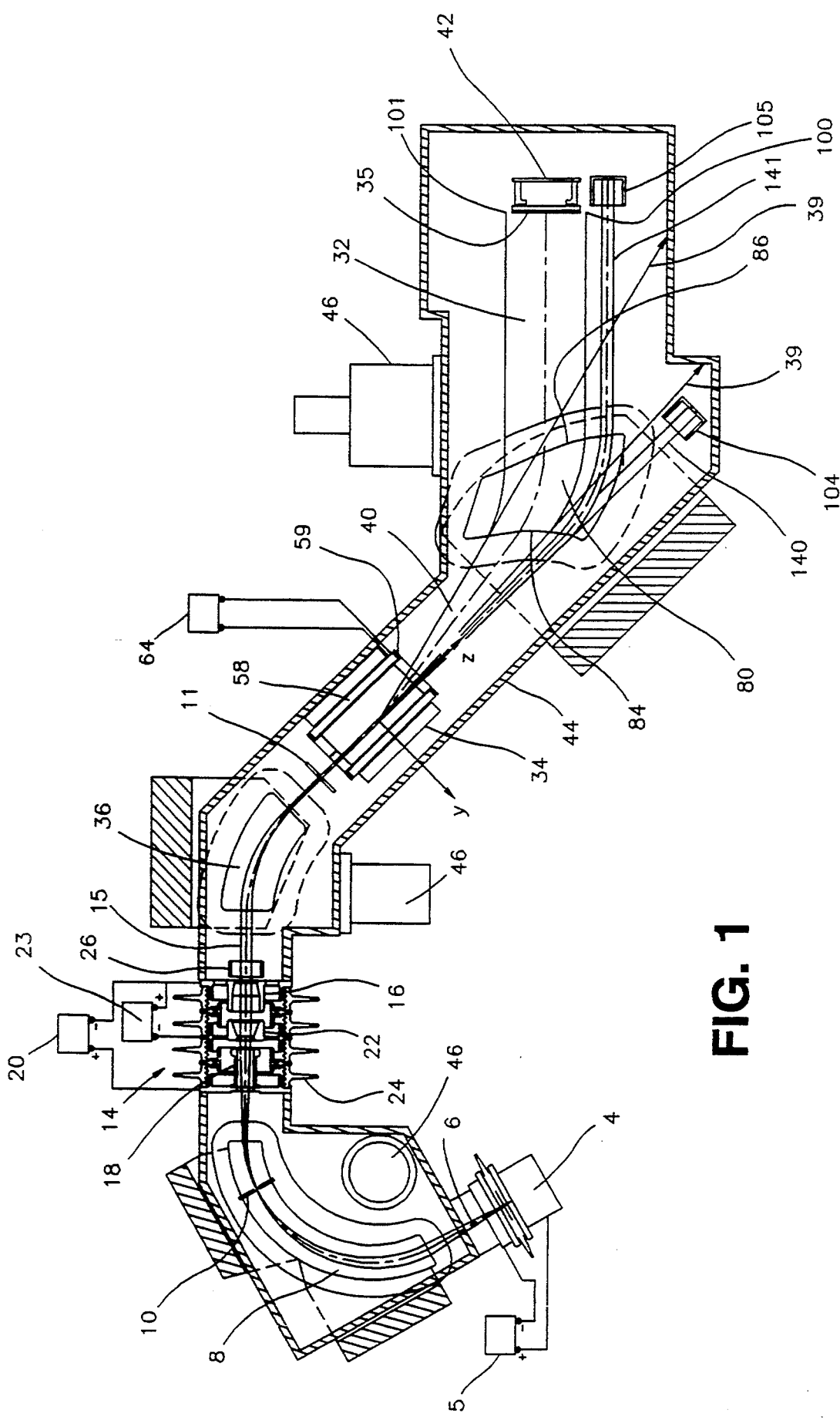

Electron Gyro-radius (mm)

Field (Gauss)

SYSTEM AND METHOD FOR UNIPOLAR MAGNETIC SCANNING OF HEAVY ION BEAMS

FIELD OF THE INVENTION

This invention relates to magnetic systems such as ion implanters that scan heavy ion beams of atoms and molecules of the elements.

BACKGROUND OF THE INVENTION

There are many industrial and scientific applications that require surfaces to be uniformly irradiated by ion beams. For example, modification of semiconductors such as silicon wafers is often implemented irradiated by a beam of ions or molecules of a specific species and energy. Because the physical size of the wafer or substrate (e.g., about 5 inches in diameter or more) is larger than the cross-sectional area of the irradiating beam (e.g., about 2 inches in diameter or less), the required uniform irradiance is commonly achieved by scanning the beam across the wafer or scanning the wafer through the beam, or a combination of these techniques.

It is distinctly advantageous to have a high beam scan rate over the substrate for a number of reasons: the irradiance uniformity is more immune to changes in the ion beam flux; a higher wafer throughput is possible at low dose levels; and for high dose applications degradation from local surface charging, thermal pulsing, and local particle-induced phenomena such as sputtering and radiation damage are greatly reduced.

Scanning techniques based only upon reciprocating mechanical motion are very limited in speed. Motion of the wafer on an arc through the beam greatly improves the scan speed but requires many wafers or substrates to be simultaneously mounted on a rotating carousel in order to obtain efficient utilization of the beam.

In a common variation, a time varying electric field is used to scan the beam back and forth in one direction, while the wafer is reciprocated in another direction. In this hybrid-type of implanter the beam current and hence rate at which wafers can be processed is severely limited by the space-charge forces which act in the region of the time-varying electric deflection fields. These forces cause the ions in the beam to diverge outward, producing an unmanageably large beam envelope. Such a space-charge limitation also occurs in implanters that use time-varying electric fields to scan the beam in two directions.

Space-charge blow-up is the rate at which the transverse velocity of a beam increases with distance along the beam axis. This is proportional to a mass normalized beam perveance $$\xi = I M^{\frac{1}{2}} E^{-3/2} \tag{1}$$

where I is the beam current, M is the ion mass, and E is the ion energy. (*The Physics and Technology of Ion Sources*, Ed. Ian G. Brown, John Wiley & Sons, New York 1989). For typical ion beam configurations encountered in ion beam implanters, space-charge effects become limiting at a perveance of $\xi \approx 0.02 [mA][amu]^{\frac{1}{2}} [keV]^{-3/2}$. Thus, an 80 keV arsenic beam becomes space-charge limited at $\approx 1.7$ mA, while a 5 keV beam is space-charge limited at just $\approx 0.03$ mA. Therefore, scanning an ion beam with an oscillatory electric field is not viable for an efficient commercial ion implanter in which the beam current is preferably greater than a few milliamperes, even at energies as low as 10 keV.

A scanning magnet that produces a high frequency time-varying magnetic field for scanning ion beams in implanters is described by one of the inventors in U.S. Pat. No. 5,311,028, in which a scanning magnet that has a yoke formed from laminations of high magnetic permeability separated by relatively thin electrically insulating material can be used to scan high perveance, heavy ion beams at frequencies up to 1,000 Hz.

SUMMARY OF THE INVENTION

The present invention addresses unexpected plasma conditions that can occur and have been observed in magnetic ion beam scanning and provides techniques to enhance the radiation uniformity, accuracy and repeatability of ion beam scanning. This effect appears as a sudden change in the beam emittance (i.e., the area occupied by all of the ions when displayed on a plot of ion angle versus position) when the scanning magnetic field used to scan the ion beam passes through or approaches zero.

According to one aspect of the invention a magnetic system has been invented for producing a strong magnetic field modulated at a fundamental frequency of at least 20 Hz for uniformly scanning ion beams that substantially eliminates or compensates for the above-observed effect comprising: a magnetic scanning structure having poles with respective pole faces that define therebetween a gap through which the ion beam passes, the magnetic structure comprising, at least in part, laminations of high magnetic permeability material each having thickness in the range between about 0.2 and 1 millimeter, the laminations being separated by relatively thin electrically insulating layers, the laminations providing a low reluctance magnetically permeable path for the fundamental frequency and higher order harmonic components of the strong magnetic field, the laminations serving to confine induced eddy currents to limited values in local paths in respective laminations; and scanning coils associated with said magnetic scanning structure and energized by a scanning current source, the scanning current source being selected to apply to the scanning coils an excitation current to generate in the gap a substantially unipolar scanning magnetic field that varies in magnitude above a predetermined minimum value, as a function of time to cause scanning of the ion beam at a rate of at least 20 Hz, the minimum value being sufficiently greater than zero to prevent the transverse cross-section of the ion beam from substantially fluctuating in size while the ion beam is being scanned across the selected surface.

An induced electric field, associated with the time-varying magnetic scanning field, inductively accelerates or decelerates neutralizing electrons in the ion beam depending upon the relative change of the magnitude of the scanning magnetic field. As the magnetic scanning field decreases to a small magnitude, the neutralizing electrons within the beam expand over an area that is comparable or greater than the beam cross-section. Whereas, as the magnetic scanning field increases in magnitude to greater than, e.g., about 50 Gauss, the neutralizing electrons are compressed into an area that is typically less than the cross-sectional area of the beam. The inventors believe that the rapid redistribution of electron density resulting from the above-mentioned induced electric fields generates a plasma effect that causes the emittance of the ion beam to fluctuate in the manner observed.

The novel scanning system according to the invention provides a magnetic circuit that maintains the magnitude of the magnetic fields in the gap at a sufficient level to prevent the transverse cross-section of the ion beam from fluctuating in size while the ion beam is being scanned across the selected surface.

Thus, the inventors have discovered a magnetic system for uniformly scanning ion beams that substantially minimizes changes or fluctuations in the beam size, and that enables repetitive scanning at high rates, high accuracy and improved repeatability.

Preferred embodiments of the invention includes one or more of the following features.

The magnitude of the magnetic field in the gap is preferably at least about 50 Gauss, and more preferably at least about 200 Gauss. An apparatus is provided that includes the above deflection system and preferably includes a source of an ion beam to introduce the ion beam into the gap. The apparatus also preferably includes an end station arranged to position a semiconductor substrate having a selected surface for receiving the scanned ion beam.

In certain embodiments, the source is positioned to introduce the ion beam close to one side of the gap defined by the pole faces. In certain other embodiments the ion beam enters the gap along a first beam path and the time-varying magnetic field deflects the ion beam in a scanning plane.

In certain preferred embodiments, the ion beam passes along a first beam path and a dc sector collimator magnet is positioned to receive the ion beam after the beam has passed through the gap and has been deflected to one side of the first beam path as a result of the influence of the unipolar scanning magnetic field the sector magnet being constructed and arranged to apply to the thus scanned ion beam a substantially static magnetic field that deflects the scanned ion beam in a direction further away from the first beam path in the scanning plane so that the beam at all times travels at a substantial angle relative to the direction of the first beam path to cause a substantial proportion of neutral particles that may exist within the ion beam to be removed from the beam before the beam irradiates the selected surface. Preferably the dc sector magnet includes contours shaped according to polynomials of greater than second order, and more preferably the polynomials are of fourth order. An important embodiment, includes a beam collection cup positioned in proximity to the ion beam for sensing the transverse position of the ion beam and means coupled to the collection cups for adjusting the magnitude of the static magnetic field of the dc sector magnet to values selected based upon the position of the ion beam sensed by the collection cup to substantially control the angle at which the ion beam impinges on the selected surface.

In another important aspect, the invention features a vacuum housing extending from the ion source, about the magnetic system to the end station whereby the beam is exposed directly to the surfaces of the deflection system as the beam travels under vacuum from the ion source to the end station.

In another aspect, the invention features a magnetic deflection system for scanning an ion beam over a selected surface comprising: a magnetic scanning structure having poles with respective pole faces that define therebetween a gap through which the ion beam passes; and scanning coils associated with the magnetic scanning structure and energized by a current source coupled to the scanning coils adapted to apply to the scanning coils an excitation current to generate in the gap a substantially unipolar scanning magnetic field that varies in magnitude, above a preselected minimum value to cause scanning of the ion beam, the substantially unipolar magnetic field having a magnitude minimum value being sufficiently greater than zero to prevent the transverse cross-section of the ion beam from substantially fluctuating in size while the ion beam is being scanned across the selected surface.

Preferred embodiments according to this aspect include at least one sector magnet disposed in the path of the ion beam and adapted to deflect the ion beam in a direction toward the selected surface in a manner enabling separation of neutral particles from the ion beam before the neutral particles impinge upon the selected surface.

In another general aspect, the invention features a method for scanning an ion beam over a selected surface comprising the steps of: providing a magnetic structure having poles with respective scanning coils and respective pole faces that define a gap therebetween; passing an ion beam into the gap along a first beam path ; generating an energizing waveform in the scanning coils to generate in the gap a substantially unipolar scanning magnetic field that varies in magnitude, above a preselected minimum value, as a function of time to cause scanning of the ion beam, to one side of the direction of the first beam path as a result of the influence of the unipolar scanning magnetic field the minimum value being sufficiently greater than zero to substantially prevent the transverse cross-section of the ion beam at the selected surface from substantially fluctuating in size while the ion beam is scanning over the selected surface; and further deflecting the ion beam after the beam has passed through the gap in a direction away from the first beam path so that the beam travels at a substantial angle relative to the direction of the first beam path to cause a substantial the proportion of neutral particles that may exist in the beam to be removed from the beam before the beam irradiates the selected surface.

Other features and advantages of the invention will become apparent from the following description and from the claims.

DESCRIPTION OF THE PREFERRED EMBODIMENTS

Figure 2:
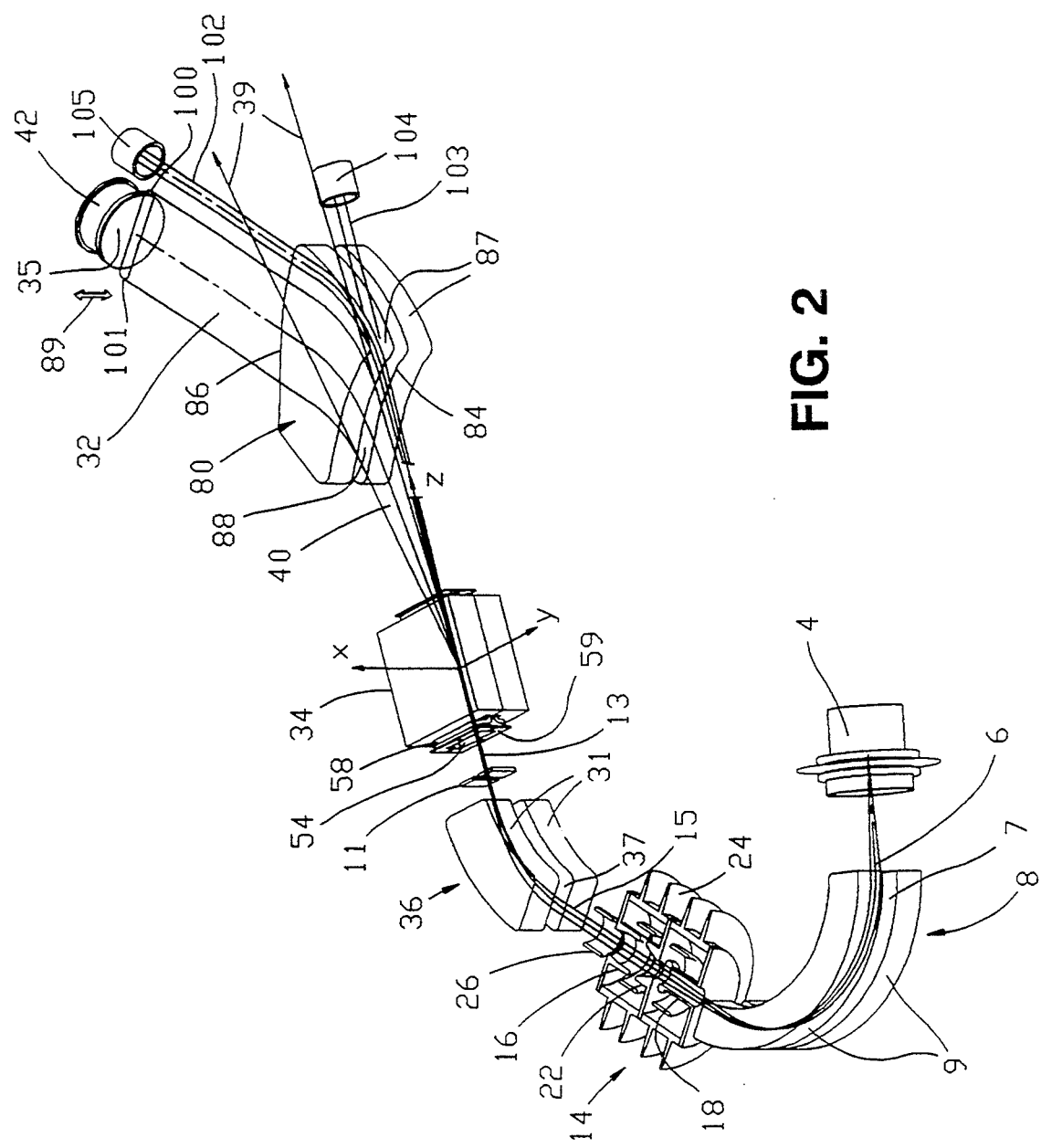
FIG. 2 is a perspective view of the ion beam system shown in FIG. 1.
Figure 1:
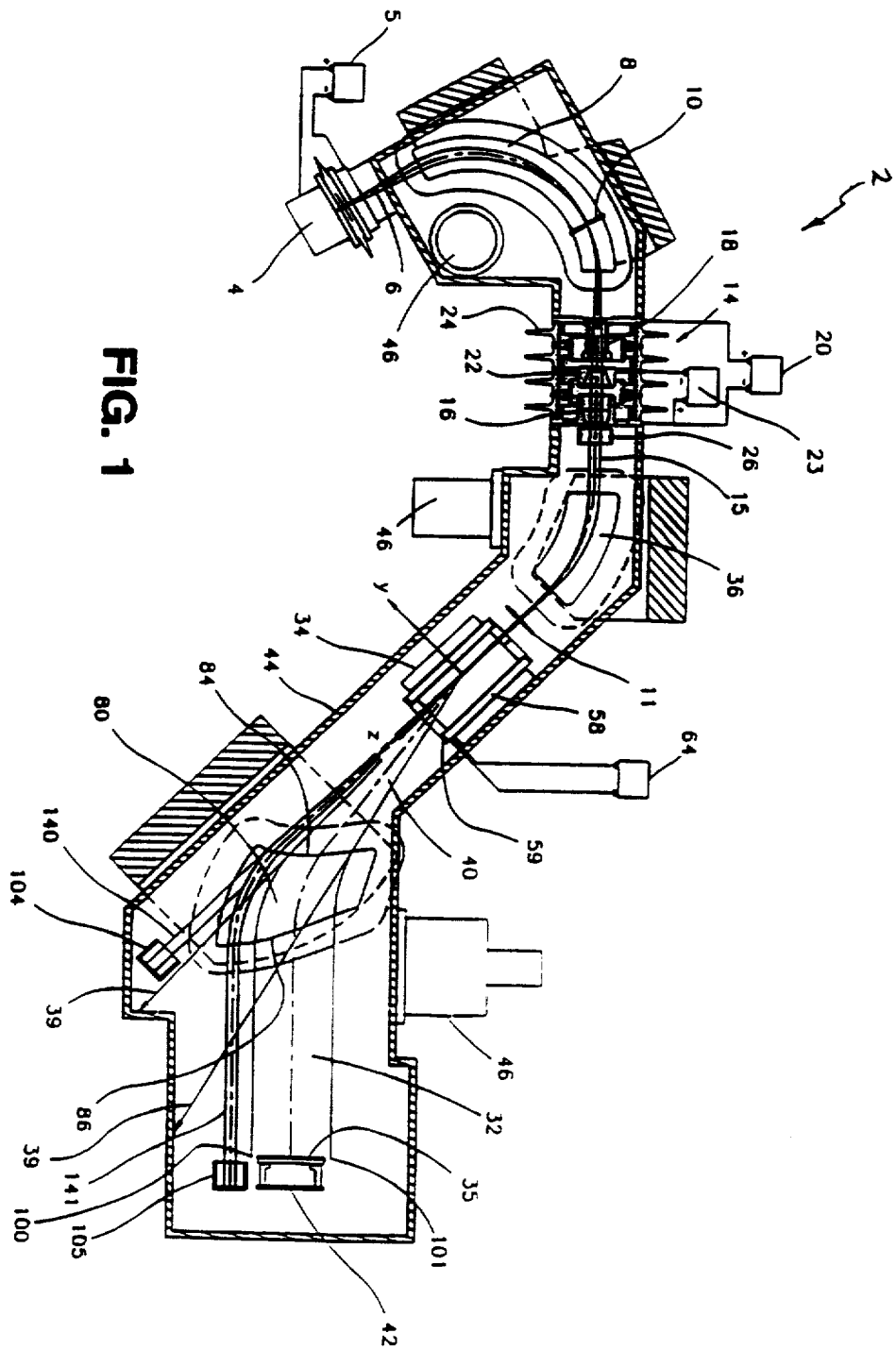
FIG. 1 is a schematic diagram of a preferred ion beam system including a scanner magnet that is acting on an ion beam to irradiate the surface of a wafer.
Figure 3:
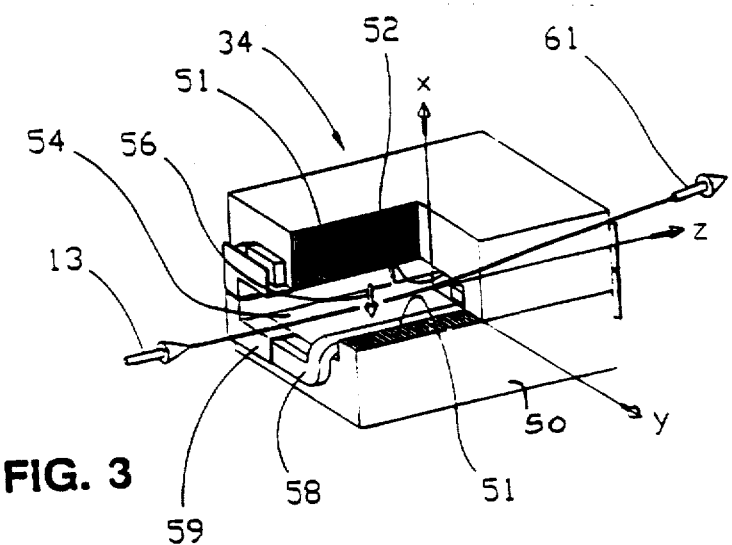
Figure 4:
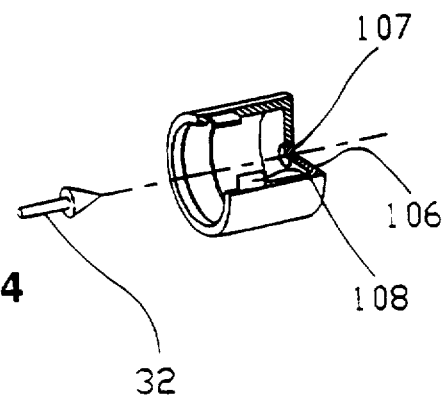
Figure 5:
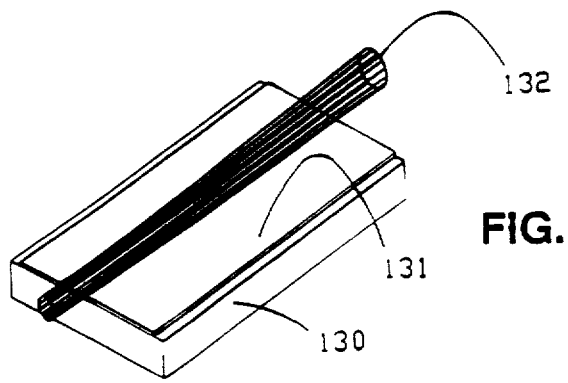

Referring to FIGS. 1 and 2, an ion implanter 2 includes a scanner magnet 34 and a collimator magnet 80 which are employed to transport and scan a high perveance, heavy ion beam in a manner in accordance with the present invention. The beam is scanned by a time-varying magnetic field produced in the working gap 54 of a magnetic scanner 34. The scanner magnet is oriented so that the magnetic field is in the vertical x direction, which causes the beam to be deflected back-and-forth as a function of time in the yz plane. The beam is deflected by the scanner to describe a fan-shaped envelope 40 over time, as shown in FIG. 2. The sector collimator magnet 80 applies a substantially time-independent magnetic field to the ion beam which passes through a working gap 88 located between the pole pieces 87 of the collimator.

The field generated by the collimator further deflects the beam in the yz plane in a direction away from the original beam axis through the scanner (i.e., the same sense as the deflection produced by the scanner magnet). The entrance pole edge 84 and the exit pole edge 86 of the collimator are specifically contoured to deflect the ion beam 32 so that the principal axis of the beam that emerges from the collimator is substantially constant, irrespective of the deflection angle produced by the scanner magnet. Consequently, the beam executes a parallel scan as a function of time across the surface of a wafer 35, between the position limits 100 and 101.

The wafer is mounted on a platen 42 and is mechanically reciprocated 89 in the x direction along a linear or arcuate path through the scanning ion beam 32 at a rate of at most one or two passes per second. By using a high magnetic scanning frequency, preferably at least 20 Hz, and more preferably 100 to 500 Hz, relative to the mechanical reciprocation frequency, much of the wafer surface is irradiated in just one pass of the wafer through the beam. Thus, a uniform irradiance over the entire surface of the wafer is achieved after just a few reciprocations through the beam.

We have discovered that substantial fluctuations occur in the transverse beam size at the wafer surface if the scanning magnetic field passes through zero or becomes less than about 50 to 200 Gauss. These fluctuations, if left uncorrected, can degrade the uniformity of irradiation. The invention achieves a substantial improvement in the uniformity of surface irradiation by energizing the coils 58 of the scanner with an electric current waveform that produces time-varying, unipolar magnetic field that has a minimum magnitude that is large enough to prevent the transverse cross-section of the ion beam from substantially fluctuating in size while the beam is being scanned across the selected surface.

Heavy ions, such as those derived from the elements of boron, nitrogen, oxygen, phosphorus, arsenic, or antimony, are generated and formed into a beam 6 by an ion source 4 (see e.g., *The Physics and Technology of Ion Sources*, Ed. Ian G. Brown, John Wiley & Sons, New York 1989). The ion source produces very high perveance ion beams as defined in Eq. 1, and an adjustable voltage power supply 5 is used to accelerate the ion beam to an adjustable energy up to about 80 keV per charge state. Electrons generated by the energizing of the ion beam 6 become trapped or confined within the ion beam. Thus, the ion beam becomes nearly electrically neutral in the absence of external electric fields and insulating surfaces. Under such conditions, the ion beams can be transported in the regions of high vacuum in the ion implanter 2, without exhibiting beam divergence from the action of repelling space-charge forces.

Atomic or molecular species in the ion beam are purified by the cooperative action of a sector bending magnet 8 that includes pole pieces 9, and a resolving slit 10. The pole pieces define therebetween a working gap 7 which receives ion beam 6. A static magnetic field in the x direction deflects the beam in the yz plane and purifies the ion species transmitted through the slit 10, according to the ratio of ion momentum to electric charge (i.e., $Mv/q$, where v is the ion velocity, q is the ion electric charge, and M is the ion mass as previously defined in Eq. 1). The ion species may be positively or negatively charged. We note that positively charged ions are more readily produced in copious quantities with typical ion sources. The sector magnet 8 has pole caps with a shape and a form suitable to focus the ion beam 12 that emerges from the magnet to a more or less ribbon-shaped beam in which the narrow dimension corresponds to the width of resolving slit 10 (see, e.g., H A Enge, "Deflecting Magnets," "published in *Focusing of Charged Particles*, vol. III, Ed. A. Septier, Academic Press, New York 1967).

In many applications, a post-accelerator 14 is needed to obtain the final required energy. Commonly, this is achieved electrostatically by creating a potential difference along the ion beam path between first and last electrodes 18, 16, respectively, using a high voltage power supply 20 of appropriate polarity to cause the electric field between the first and last electrodes to accelerate the heavy ions toward the last electrode. Insulator rings 24 are used to electrically isolate the electrodes from each other. Deceleration can be achieved by reversing the polarity of the power supply 20. The potential on an intermediate electrode 22 can be adjusted to focus the ion beam by varying the potential of power supply 23. A suppressor electrode 26 is fitted at the negative end of the post-accelerator to prevent neutralizing electrons from becoming drained out of the beam which would tend to cause the beam to diverge as a result of space-charge effects.

A final energy bending magnet 36 that has a working gap 37 defined between pole pieces 31 is positioned upstream of the scanner magnet 34. Bending magnet 36 produces a substantially static magnetic field in the x direction which bends the beam in the yz plane. A second resolving slit 11 further purifies the ion species in the beam.

The beam is transported from the source 4 to the wafer 35 inside a vacuum envelope 44 that is maintained under high vacuum by vacuum pumps 46.

Figure 3:
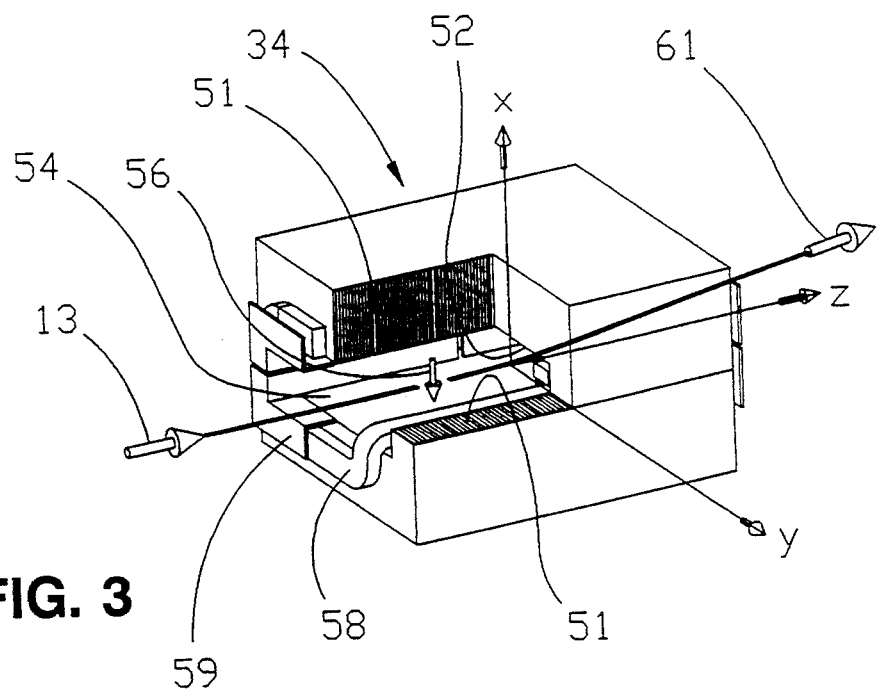
FIG. 3 is a perspective view of a scanner magnet for use in the ion beam system of FIG. 1.
Figure 6:
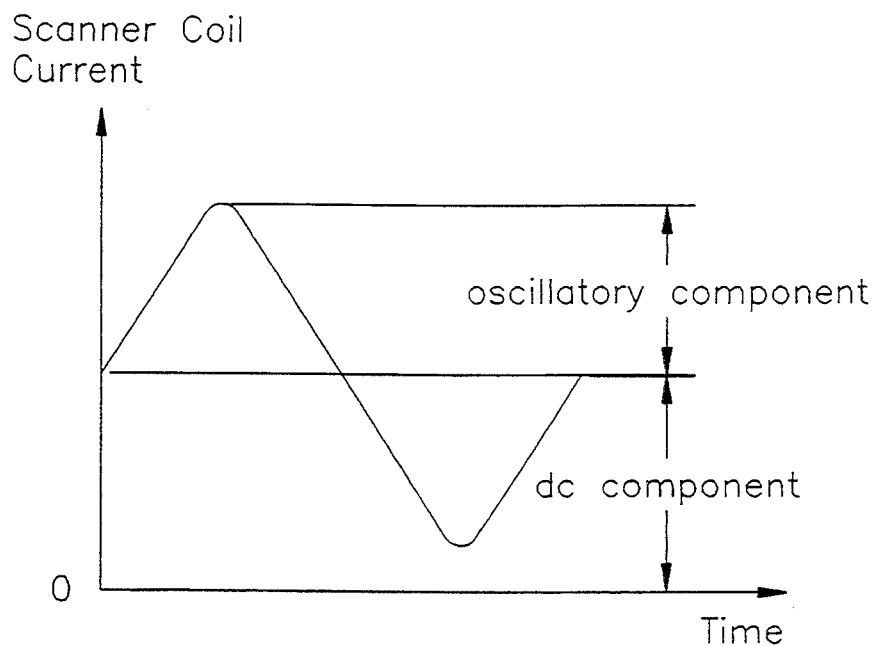
FIG. 6 is a schematic plot of the variation of an energizing current through a scanning coil as a function of time.

The basic structure of the scanner magnet 34 is shown in FIG. 3. A yoke 50 is constructed from thin ferromagnetic laminations 51, which preferably have a thickness in the range of 0.2 to 1 mm, with relatively much thinner inter-lamination insulating material (e.g., 0.03 mm epoxy impregnated cellulose). Pole faces 52 define a working gap 54 therebetween in which the high perveance, heavy ion beam 13 is admitted and scanned back and forth in a plane parallel to the pole faces 52 by a time-varying magnetic field 56 generated by energizing the scanning coils 58 with an electric current that has a sufficient dc component superimposed on the oscillatory time-dependent component as shown in FIG. 6, to ensure the resultant time-varying magnetic field never changes polarity and never becomes too small while the beam is irradiating the wafer. As previously mentioned, avoiding a weak time-varying magnetic field eliminates fluctuations in the transverse ion beam size at the wafer which in turn improves the irradiance uniformity over the wafer surface. As a consequence of energizing the scanning coils with a biased triangular waveform current according to FIG. 6, the beam is caused to make a biased scan in the sense that deflection is always to one side of the incoming beam direction, as shown in FIGS. 1 and 2.

The ion implanter is designed to minimize the energizing power requirements needed for the generation of a biased scan. As shown in FIG. 6, in order to generate a biased scan, the magnetic field strength must be more than double the peak field strength needed to generate a similar deflection range as achieved by a substantially oscillatory magnetic field that deflects the beam equally to either side of the incoming beam direction. For a fixed width of the scanner working gap in the y direction, doubling the peak field strength causes to a proportionate doubling of the energizing power. In order to avoid an even higher power as a result of using a larger gap width, the scanner magnet is positioned so that the incident axis of the beam is substantially closer to one side of the working gap than the opposite side. The beam is deflected in a direction away from the side of the gap closer to the incident axes of the beam and toward the opposite side of the gap, as shown in FIG. 1.

As shown in FIG. 1, the scanner magnet is located entirely inside the vacuum envelope 44. Except for the negligibly small area of the edges of the inter-lamination insulating material, the pole faces facing the beam are electrically conducting and are held at ground electrical potential to avoid generating electric fields in the vicinity of the beam, a necessary requirement for preventing space-charge forces from affecting the transport of a high perveance heavy ion beam through the scanner magnet gap. For the same reason, the insulating surfaces of the coils and the electrical leads to and from the coils are hidden from the beam with electrically grounded shields 59. If the vacuum envelope passed through the working gap and between the pole faces of the scanner magnet, the magnetic field volume and hence power requirements would be substantially increased for a given free working gap in which to admit the beam. Furthermore, the material of the vacuum wall would need to be an electric conductor and not an insulator, in order to define a constant potential in the vicinity of the beam. In order to avoid large eddy currents from being induced in the vacuum walls, the vacuum walls themselves would have to be made from a semiconductor material, or a laminated structure similar to the scanner magnet except that the laminations would be non-ferromagnetic.

The laminated structure described above is an efficient method for generating strong magnetic fields in the working gap with a minimum power requirement and a minimum resistive loss from eddy currents. Other details, and alternative forms for the basic structure of the scanner magnet, are described by H. F. Glavish, U.S. Pat. No. 5,311,028, May 10, 1994, and H. F. Glavish and M. A. Guerra, *Nucl. Instr. & Methods,* B74 (1993) 397, both of which are incorporated herein by reference.

The references above also describe the use of ferrite material rather than laminations for the express purpose of avoiding large eddy currents. Ferrite material is substantially more expensive than laminations. Also, present day material does not support such strong magnetic fields. Ferrite material is an electrical insulator. Consequently, if it is used for the pole pieces or as any part of a surface facing the beam, then such surfaces must be shielded from the beam either using a silicon shield as shown in FIG. 5, or using an electrically conducting wire mesh or grid that is constructed to eliminate eddy current effects.

Figure 5:
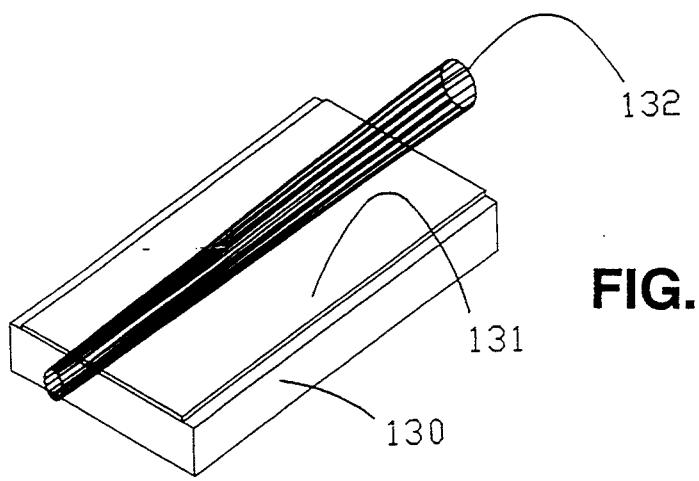
FIG. 5 is a perspective view of a silicon liner placed on a pole surface of a magnet.

Referring to FIG. 5, there is shown a thin silicon liner 131 shielding the beam 132 from the pole surface 130. Pure silicon is used as a liner for two reasons. First, since the liner is made of silicon, any sputtered particles resulting from the liner would at least be compatible with, e.g., silicon wafer substrates, and would not tend to contaminate and degrade the quality of the devices formed on the irradiated wafers. Secondly, because silicon is an electrical conductor it defines a constant potential in the neighborhood of the beam, yet the electrical conductivity of silicon is sufficiently low that the silicon can be used in scanning magnets with acceptably small eddy current effects. Silicon can be used as a liner for dc magnets such as the collimator 80 in order to avoid sputtering contamination of the wafer.

Electrons of a few electron-volt energy are typically generated by the atomic interaction of the ions in the ion beam with the residual gas molecules in the vacuum system (see, e.g., in A. J. T. Holmes, *Beam Transport of the Physics and Technology of Ion Sources,* Ed. Ian G. Brown, John Wiley & Sons, New York 1989). In the vicinity of the ion beam, such electrons play an important role in neutralizing all but a small fraction of the positive charge associated with the ions of the beam. In some instances, neutralizing electrons are also generated directly from hot filaments or plasma guns, but this is not generally necessary for the transport of typical high perveance heavy ion beams through the magnets and field free regions found in a typical ion implanter. In the vacuums of approximately $10^{-6}$ torr used in ion implanters a sufficient number of electrons are generated by the beam, within fractions of a millisecond, to maintain the charge-neutrality of the beam.

Hitherto, it has been thought that detrimental time-dependent space-charge effects would be absent in magnetic scanning of ion beams used in ion implanters because of the very high rate of generation of electrons relative to the rate at which the transverse position of the beam changes. Indeed, to those skilled in the art, the magnetic field of the scanner are commonly regarded as quasi-static with respect to space-charge effects.

Figure 7:
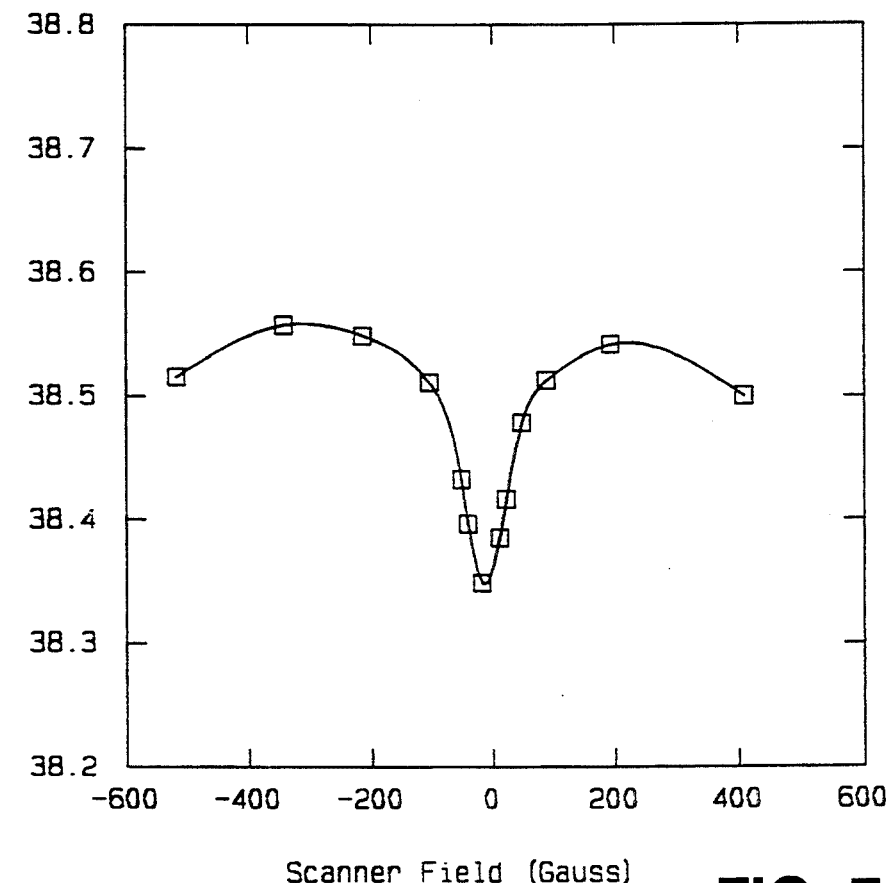
FIG. 7 is a plot of the variation in oxygen ion beam current at the wafer surface as a function of the magnitude of the scanner magnetic field.

However, we have discovered a plasma effect that manifests as a sudden change in the beam emittance when the magnitude of the magnetic field in the gap passes through or approaches zero. An example of our experimental data is shown in FIG. 7, which vividly illustrates how the current of a high perveance 178 keV, 150 Hz scanning oxygen beam undergoes a sudden fluctuation of ≃0.7% near a zero field. The data shown has been taken using a scan frequency of f=150 Hz over a phase range of $\phi=-70°$ to $\phi=60°$ where $\phi=360$ ft. The oscillatory magnetic field (in Gauss) varied with phase according to the equation $$B \simeq 706.5 \left(\frac{\phi}{90}\right) - 61.28 \left(\frac{\phi}{90}\right)^2 - \qquad (2)$$

$$123.7 \left(\frac{\phi}{90}\right)^3 + 22.4 \left(\frac{\phi}{90}\right)^5 \quad (-90° \leq \phi \leq 90°)$$

The fluctuation near zero field shown in FIG. 7 is for just one scan sweep, but it accurately reproduces itself in successive scan sweeps. The measured beam current in the data shown in FIG. 7 is sensitive to changes that occur in the phase-space emittance of the beam in the direction transverse to the scan direction due to a limiting aperture that is placed before the current measuring apparatus. If the above-described effects are not substantially eliminated, or substantially compensated for by appropriate correction of the energizing waveform, a 1% or more irradiance non-uniformity can result.

In the presence of a magnetic field B, the neutralizing electrons of a beam experience a Lorentz force and gyrate around the magnetic field lines with an angular frequency $$\omega = \frac{e}{m} B \qquad (3)$$

where $B = |B|$ is the magnitude of the magnetic field, m is the mass of an electron, and e is the charge of an electron. When projected on a plane perpendicular to B, the electrons describe a circle of radius $$r = \frac{mv_t}{eB} \qquad (4)$$

where $v_t$ is the electron velocity component transverse to the direction of the magnetic field B. The energy associated with the orbital motion is $$U = \tfrac{1}{2} m v_t^2 \qquad (5)$$

Figure 8:
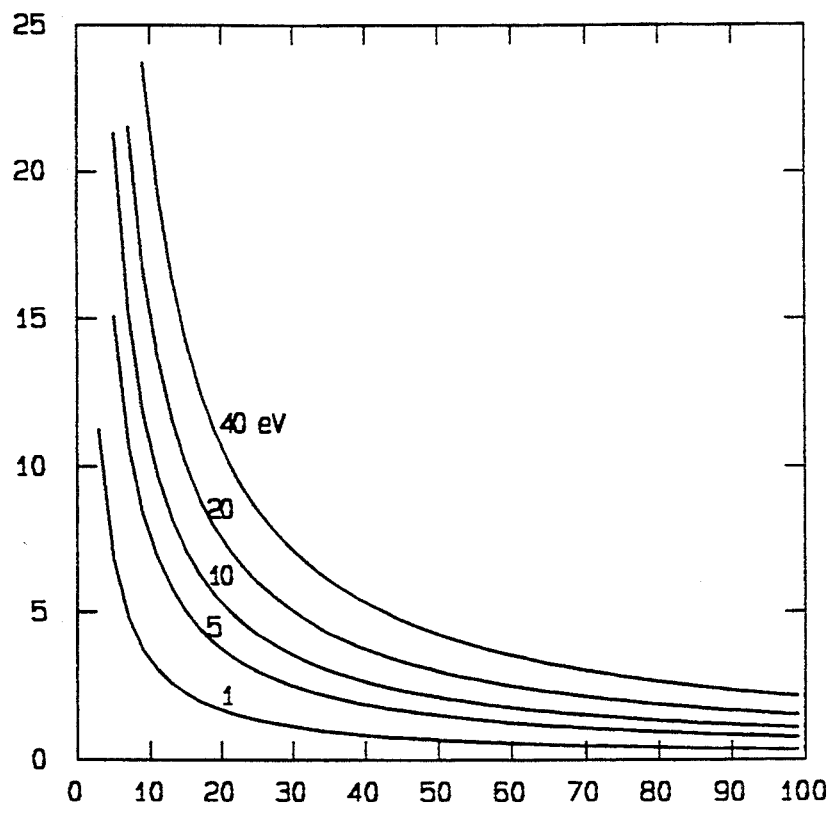
FIG. 8 is a plot of the gyro-radius of an electron as a function of magnetic field strength and electron energy.

Since the magnitude of the electron gyro-frequency (w≃17.6 MHz per Gauss) is much greater than the scan frequency of the magnetic field (~1 kilohertz or less), the electron orbital motion is adiabatic in the sense that for a small fractional change to occur in the radius r, an electron will make many revolutions around B. Referring to FIG. 8, the electron gyro-radius is plotted as a function of electron energy and magnetic field. At fields less than a few tens of Gauss the gyro-radius increases to the point where it becomes comparable to the beam dimension. However, this phenomena alone does not appear to account for the observed time-dependent fluctuation in the ion beam current, because in the absence of a significant magnetic field, the electron motion is determined principally by the forces associated with particle charges. Moreover, as previously discussed, beam neutralization occurs in a very short time relative to the time interval over which the fluctuation occurs (~1 millisecond).

Figure 9:
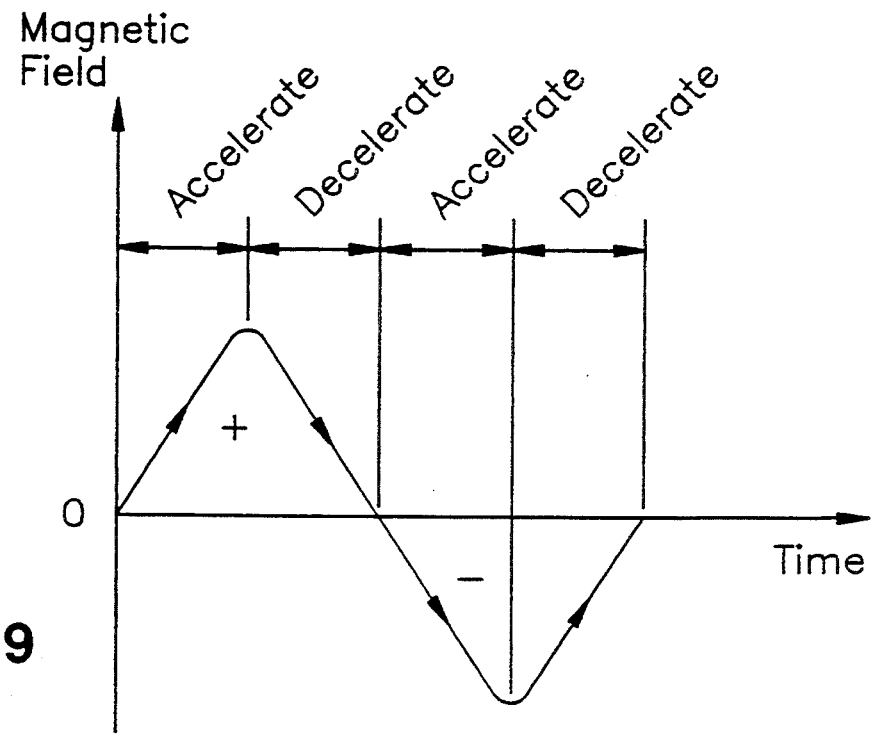
FIG. 9 is a plot of an oscillatory magnetic field as a function of time showing the regimes in which the inductive electric field accelerates or decelerates electrons.

To better account for the observed phenomena, we realized that, according to Maxwell's equations for the description of classical electromagnetic phenomena, there is associated with the time variation of the scanner field B, an electric field E given by $$\nabla \times E = -\frac{\partial B}{\partial t} \qquad (6)$$

and that such a field must inductively accelerate, or decelerate, electrons according to whether the amplitude of B is increasing or decreasing, as shown in FIG. 9. Indeed, the change in orbital energy per revolution is $$\delta U = \oint eE \cdot ds = e\int_s (\nabla \times E) \cdot dS = -e\int_s \frac{\partial B}{\partial t} \cdot dS \qquad (7)$$

If we now invoke the adiabatic condition that the radius is essentially constant for one revolution, we obtain from Eqs. 3, 4, and 5.

$$\delta \left(\frac{U}{B}\right) = 0 \qquad (8)$$

$$\delta(r^2 B) = \delta(r^2 U) = 0$$

The first of these equations shows that the electron rotational energy changes proportionately with the magnetic field strength. The second equation expresses the conservation of angular momentum and shows that the area $\pi r^2$ of an electron orbit varies inversely with the amplitude of the magnetic field strength and electron energy. The effects arising from the inductive electric fields are significant. For example, as the field increases from say 5 to 50 Gauss, the electron density is compressed by a factor of 10. The electron energy is also increased by a factor of 10 and in the presence of the magnetic field the electrons are bound to a region in the vicinity of the beam. New electrons that are generated as the magnitude of the magnetic field is increasing are also subject to the compression resulting from the inductive acceleration. In this regime, the electron spatial distribution is dominated by the action of magnetic field rather than by the action of the system of ion charges in the beam.

As the field increases beyond 50 Gauss, compression continues to occur but the effect is not so dramatic because the gyration radius of the electron is already substantially less than the typical transverse dimension of the beam.

When the magnetic field amplitude decreases towards zero the electron orbits expand according to Eq. 8. When the magnetic field strength is less than approximately 50 Gauss, the electrons in the electron orbits that were previously compressed are now rapidly decelerated and expand over an area that is comparable to or greater than the beam cross section. New electrons that are generated, already have a low energy, and are not so significantly affected by the inductive electric field.

Figure 10:
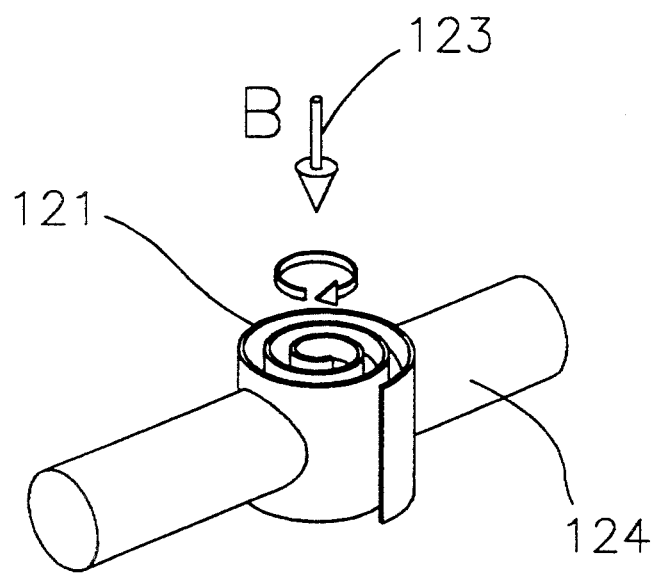
FIG. 10 is a schematic diagram illustrating how inductive deceleration causes the orbits of electrons in an ion beam to spiral outward as the magnetic field amplitude decreases with time.
Figure 10A:
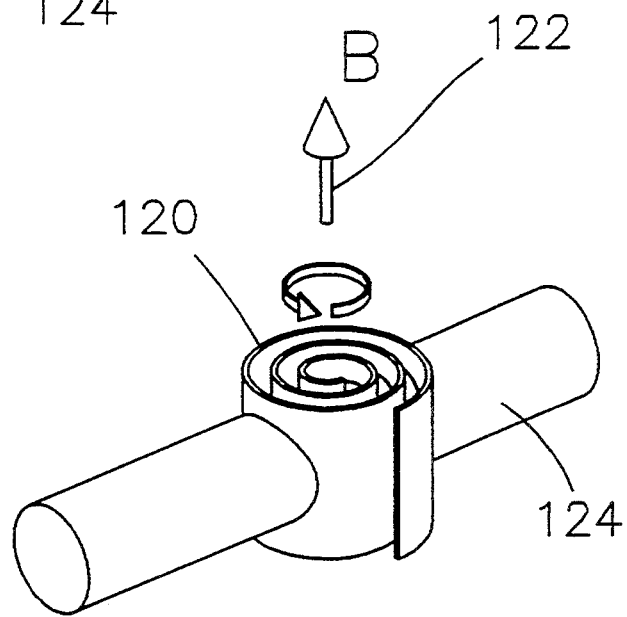
FIG. 10A is a schematic diagram illustrating how inductive acceleration causes the orbits of electrons in the ion beam to spiral inward as the magnetic field amplitude increases with time.

The sequence of events occurring in the scanner with elapsed time is schematically illustrated in FIGS. 10 and 10A.

Referring to FIG. 10, as the magnetic field 123 approaches zero the inductive deceleration causes electron orbits to describe an outward spiralling envelope 121 thereby reducing the electron density in the region of the ion beam 124. After the magnetic field passes through zero it has the opposite direction and the rotation direction of the electron orbits 120 is reversed, as shown in FIG. 10A. As the magnetic field 122 now increases in amplitude, inductive acceleration causes the electron orbits to adiabatically spiral inward thereby increasing the electron density in the region of the ion beam 124. The rapidly changing electron density caused by the magnetic field passing through zero provides a plausible explanation for the observed fluctuations in the phase-space emittance of the ion beam.

Experimental observations have only been made on magnetically scanned high perveance positive heavy ion beams. However, since electrons are produced at a very high rate by negative ion beams and are a part of the overall beam neutralization phenomena in both the negative and the positive potential plasma regimes, it is expected that similar fluctuations will occur and that the present invention will also have important application for the scanning of high perveance negative ion beams.

Referring to FIGS. 1 and 2, an important aspect of the invention concerns the cooperation of the sector collimator magnet 80 with the scanner magnet 34 in regard to the different paths the beam takes to the wafer at different times during the scan cycle. The contours of the entrance and exit pole edges 84, 86 are fourth order polynomials with coefficients chosen to simultaneously achieve the following ion optical transport and focusing conditions while the beam is impinging on the wafer, irrespective of scan position:

1. Maintain a parallel scan as previously described to a precision of better than ±0.5° and preferably ±0.2°.
2. Maintain the range of variation of the prescribed maximum angular divergence of the beam (typically about 0.50 to 1.50) substantially within a limit of ±0.5°.
3. Maintain the prescribed transverse beam size (typically 30 to 50 mm) substantially within a limit of ±5 mm.
4. Produce sufficient deflection of the beam (e.g., at least about 30° and more preferably greater than about 45°) to minimize the number of neutral particles 39 striking the wafer after being formed by the ions of the beam interacting with residual gas molecules in the vacuum system prior to the beam entering the sector collimator magnet.

In general, a conventional sector magnet with pole edge contours limited to second order curvatures on the entrance and exit pole edges cannot achieve all of the above-mentioned requirements simultaneously (see, e.g., H. A. Enge, "Deflecting Magnets," published in *Focusing of Charged Particles*, vol. II, Ed. A. Septier, Academic Press, New York 1967). The limitations of second order curvatures is underscored if the collimator deflection becomes larger than about 30° and more preferably larger than about 45°. Fourth order contours on the entrance and exit pole edges of the sector collimator enables such large angle deflections to be achieved, which results in satisfactory isolation of the wafer from neutral particles, and yet allows the above-mentioned ion optical transport and focusing constraints to be realized.

Figure 4:
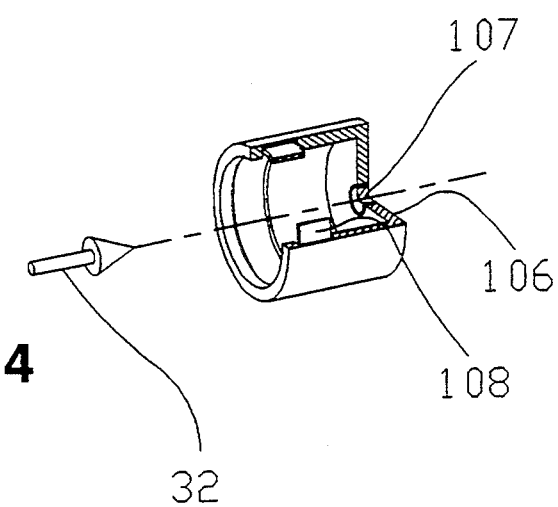
FIG. 4 is a perspective view of a beam collection cup with a beam-centering electrode.

Referring to FIGS. 1 and 2, another important aspect of the invention concerns the use of beam collection cups 104 and 105 to respectively set the magnetic field strengths in the final energy magnet 36 and the sector collimator magnet 80 at values that ensure the angle at which the ions impinge on the wafer 35 are as prescribed, irrespective of knowing or measuring the exact ion energy. Referring to FIG. 4, a beam collection cup can sense the transverse position of the beam by measuring the current from the beam collected on the small electrode 107 in relation to the current collected in the large electrode 106. Secondary electrons are optionally suppressed by holding the electrode 108 at a relative negative potential. In practice, to set the field in the final energy magnet 36, the magnetic fields in the scanner and sector collimator magnets are set to zero. The field in the final energy magnet is then adjusted until the beam is centered on the beam collector 104. Next the magnetic field in the collimator magnet is adjusted until the beam is centered in the beam collection cup 105. Now the scanner can be energized to create a parallel scan across the surface of the wafer at the prescribed angle defined by the locations of the two beam collection cups in relation to the location of the sector collimator magnet.

Figure 11:
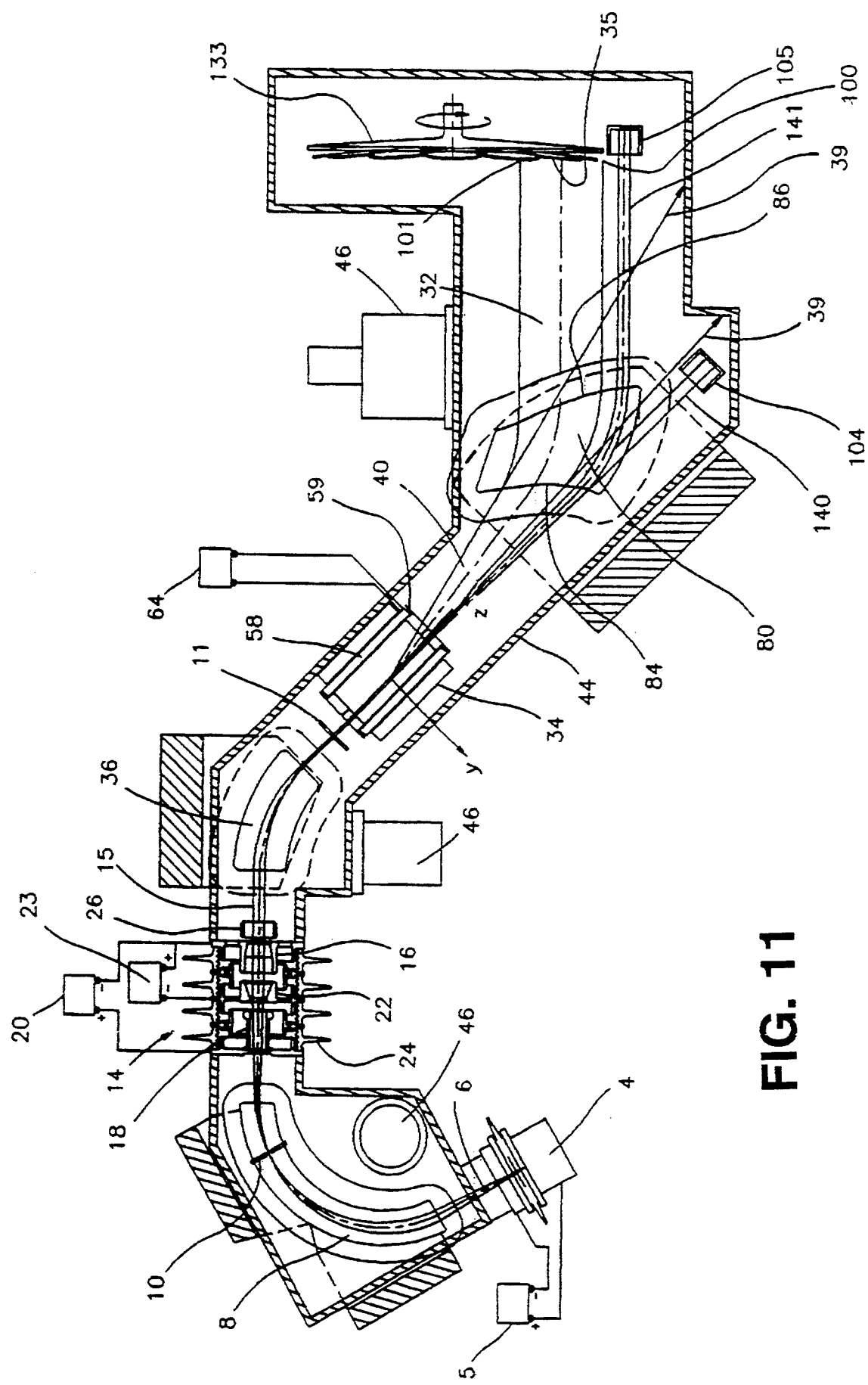
FIG. 11 is a schematic diagram of an alternative ion beam system including a scanner magnet that acts on an ion beam to irradiate the surface of a wafer.

In another preferred embodiment, rather than having a single wafer reciprocating through the scanning beam as shown in FIG. 2, several wafers can be mounted on a rotating carousel 133 as shown in FIG. 11. This embodiment is preferred in the case of very high ion beam currents because then the high beam power is distributed over several wafers during implantation.

Although specific features are shown in some drawings and not others, this is for convenience only as each feature may be combined with any or all other features according to the invention. Other embodiments will occur to those skilled in the art and are within the scope of the claims.

What is claimed is:

1. A magnetic deflection system for producing a strong magnetic field modulated at a fundamental frequency of at least 20 Hz for scanning an ion beam over a selected surface comprising:

a magnetic scanning structure having poles with respective pole faces that define therebetween a gap through which the ion beam passes, said magnetic scanning structure comprising, at least in part, laminations of high magnetic permeability material each having thickness in the range between about 0.2 and 1 millimeter, said laminations being separated by relatively thin electrically insulating layers, said laminations providing a low reluctance magnetically permeable path for said fundamental frequency and higher order harmonic components of said strong magnetic field, the laminations serving to confine induced eddy currents to limited values in local paths in respective laminations; and scanning coils associated with said magnetic scanning structure and energized by a scanning current source, said scanning current source being selected to apply to said scanning coils an excitation current to generate in said gap a substantially unipolar scanning magnetic field that varies in magnitude, above a preselected minimum value, as a function of time to cause scanning of the ion beam at a rate of at least 20 Hz, said minimum value being sufficiently greater than zero to prevent the transverse cross-section of the ion beam from substantially fluctuating in size while the ion beam is being scanned across the selected surface.

2. The magnetic deflection system of claim 1 wherein the magnitude of said magnetic field in said gap is at least about 50 Gauss while the ion beam is being scanned across the selected surface.

3. The magnetic deflection system of claim 2 wherein the magnitude of said magnetic field in said gap is at least about 200 Gauss while the ion beam is being scanned across the selected surface.

4. An apparatus including the magnetic deflection system of claim 1 and further comprising a source of an ion beam to introduce the ion beam into said gap.

5. The apparatus of claim 4 wherein said source is positioned to introduce the ion beam close to one side of the gap defined by said pole faces.

6. The apparatus of claim 4 further comprising an end station arranged to position in the path of the scanned ion beam a semiconductor substrate having a selected surface for receiving the scanned ion beam.

7. The apparatus of claim 6 further comprising a vacuum housing extending from said ion source, about said magnetic system to said end station whereby said beam is exposed directly to the pole surfaces of said deflection system as the beam travels under vacuum from said ion source to said end station.

8. The magnetic deflection system of claim 1, wherein said ion beam passes into said gap along a first beam path said system further comprising a dc sector magnet positioned to receive the ion beam after said beam has passed through said gap and has been deflected to one side of said first beam path as a result of the influence of said unipolar scanning magnetic field, said sector magnet being constructed and arranged to apply to the thus scanned ion beam a substantially static magnetic field that deflects said scanned ion beam in a direction further away from said first beam path in said scanning plane so that said beam at all times travels at a substantial angle relative to the direction of said first beam path to cause a substantial proportion of neutral particles that may exist within the ion beam to be removed from the beam before the beam irradiates the selected surface.

9. The magnetic deflection system of claim 8 wherein said dc sector magnet includes contours shaped according to polynomials of greater than second order.

10. The magnetic deflection system of claim wherein said dc sector magnet includes contours shaped according to polynomials of fourth order.

11. The magnetic deflection system of claim further comprising a beam collection cup for sensing the position of the ion beam, and means coupled to said collection cup for adjusting the magnitude of said static magnetic field produced by said dc sector magnet to values selected based upon the position of the ion beam sensed by said collection cup to substantially control the angle at which the ion beam impinges on the selected surface.

12. An apparatus including the magnetic deflection apparatus of claim 1 and further comprising a carousel for holding a number of substrates that are to be irradiated by the ion beam, said carousel being positioned in the path of the ion beam and being rotatable about an axis.

13. An ion implantation system comprising a magnetic deflection system for producing a strong magnetic field modulated at a fundamental frequency of at least 20 Hz for scanning an ion beam over a selected surface in combination with an ion source for providing a selected species of ions in the ion beam, an end station arranged to position in the path of the ion beam a semiconductor substrate having a selected surface for receiving said ion beam, and a vacuum housing extending from said ion source, about said magnetic system, to said end station, wherein said ion beam is directly exposed to the surfaces of said deflection system as the ion beam travels under vacuum from said ion source to said end station, said magnetic deflection system being constructed and arranged to scan said ion beam uniformly across said substrate at said end station to effect ion implantation in said substrate, said magnetic deflection system comprising:

a magnetic scanning structure having poles with respective pole faces that define therebetween a gap through which the ion beam passes, said magnetic scanning structure comprising, at least in part, laminations of high magnetic permeability material each having thickness in the range between about 0.2 and 1 millimeter, said laminations being separated by relatively thin electrically insulating layers, said laminations providing a low reluctance magnetically permeable path for said fundamental frequency and higher order harmonic components of said strong magnetic field, the laminations serving to confine induced eddy currents to limited values in local paths in respective laminations; and scanning coils associated with said magnetic scanning structure and energized by a scanning current source, said scanning current source being selected to apply to said scanning coils an excitation current having a fundamental frequency of the order of 20 Hz or greater together with substantially higher order harmonics to generate in said gap a substantially unipolar scanning magnetic field that varies in magnitude, above a preselected minimum value, as a function of time to cause scanning of the ion beam at a rate of at least 20 Hz, said minimum value being sufficiently greater than zero to prevent the transverse cross-section of the ion beam from substantially fluctuating in size while the ion beam is being scanned across the selected surface.

14. A magnetic deflection system for scanning an ion beam over a selected surface comprising:

a magnetic scanning structure having poles with respective pole faces that define therebetween a gap through which the ion beam passes; and scanning coils associated with said magnetic scanning structure and energized by a scanning current source, said scanning current source being selected to apply to said scanning coils an excitation current to generate in said gap a substantially unipolar scanning magnetic field that varies in magnitude above a preselected minimum value as a function of time to cause scanning of the ion beam, said minimum value being sufficiently greater than zero to prevent the transverse cross-section of the ion beam from substantially fluctuating in size while the ion beam is being scanned across the selected surface.

15. The magnetic deflection system of claim 14 further comprising at least one dc sector collimator magnet disposed in the path of the ion beam and adapted to deflect the ion beam in a direction toward the selected surface in a manner enabling separation of neutral particles from the ion beam before the neutral particles impinge upon the selected surface.

16. The magnetic deflection system of claim 14 wherein the ion beam passes into said gap along a first beam path and further comprising a beam deflector positioned to receive the ion beam after the beam has passed through said gap and has been deflected to one side of said first beam path as a result of the influence of said unipolar scanning magnetic field, said deflector being adapted to deflect the thus scanned ion beam in a direction further away from said first beam path so that said beam at all times travels at a substantial angle relative to the direction of said first beam path to cause a substantial proportion of neutral particles that may exist within the ion beam to be removed from the beam before the beam irradiates the selected surface to enable minimization of energizing power requirements of said scanning current source.

17. The magnetic deflection system of claim 16 wherein said beam deflector is a dc sector collimator magnet adapted to apply a substantially static magnetic field to the ion beam.

18. The magnetic deflection system of claim 16 wherein the ion beam passes into said beam deflector along one beam path and the beam deflector is adapted to deflect the ion beam so that the ion beam exits the beam deflector along another beam path that makes an angle of at least about 30° with said one beam path.

19. The magnetic deflection system of claim 18 wherein said angle is at least about 45°.

20. A magnetic deflection system for scanning an ion beam over a selected surface comprising:
   a magnetic structure having poles with respective pole faces that define therebetween a gap through which the ion beam passes; and
   scanning coils associated with said magnetic scanning structure and energized by waveform generating means for energizing said scanning coils to generate in said gap a substantially unipolar scanning magnetic field that varies in magnitude, above a preselected minimum value, as a function of time to cause scanning of the ion beam, said minimum value being sufficiently greater than zero to substantially prevent the transverse cross-section of the ion beam, at the selected surface, from substantially fluctuating in size while the ion beam is scanning over the selected surface.

21. The magnetic deflection system of claim 20 wherein the magnitude of said magnetic field in said gap is at least 50 Gauss while the ion beam is being scanned across the selected surface.

22. A method for scanning an ion beam over a selected surface comprising the steps of:
   providing a magnetic structure having poles with respective scanning coils and respective pole faces that define a gap therebetween;
   passing an ion beam into said gap along a first beam
   generating an energizing waveform in said scanning coils to generate in said gap a substantially unipolar scanning magnetic field that varies in magnitude, above a preselected minimum value, as a function of time to cause scanning of said ion beam to one side of the direction of said first beam path, said minimum value being sufficiently greater than zero to substantially prevent the transverse cross-section of the ion beam at the selected surface from substantially fluctuating in size while the ion beam is scanning over the selected surface; and
   further deflecting said ion beam away from said first beam path after said beam has passed through said gap and has been deflected to one side of said first beam path so that said beam travels at a substantial angle relative to the direction of said first beam path to cause a substantial proportion of neutral particles that may exist in said beam to be removed from the beam before the beam irradiates the selected surface.

* * * * *

UNITED STATES PATENT AND TRADEMARK OFFICE
CERTIFICATE OF CORRECTION

PATENT NO. : 5,438,203

DATED : August 1, 1995

INVENTOR(S) : Glavish et al.

It is certified that error appears in the above-identified patent and that said Letters Patent is hereby corrected as shown below:

Col. 6, line 28, "(My/q)" should be --(Mv/q)--.

Col. 6, lines 37, after "H" insert --,--.

Col. 6, line 38, after "A" insert --,--.

Col. 6, line 38, before "published" delete --"--.

Col. 7, line 35, after "causes" delete --to--.

Col. 7, line 42, "axes" should be --axis--.

Col. 11, line 41, "0.50" should be --0.5°--.

Col. 11, line 41, "1.50" should be --1.5°--.

Col. 13, line 46, after "claim" insert -- 9--.

Col. 13, line 49, after "claim" insert -- 8--.

Figs. 1 and 3, replace with attached figures in accordance with approved amendment of July 11, 1994.

Signed and Sealed this

First Day of April, 1997

BRUCE LEHMAN

*Attest:*

*Attesting Officer*   Commissioner of Patents and Trademarks

UNITED STATES PATENT AND TRADEMARK OFFICE
CERTIFICATE OF CORRECTION

PATENT NO. : 5,438,203

DATED : August 1, 1995

INVENTOR(S) : Glavish et al.

It is certified that error appears in the above-identified patent and that said Letters Patent is hereby corrected as shown below:

On the title page: Item
[75] after Sarah B. Cutler delete "executor"; insert -- Exeter, N.H., executrix--

In the Drawings: Sheet 1, Fig. 1, insert reference numeral --2--, as shown on the attached page.

Sheet 3, Fig.3, insert reference numeral --50--, as shown on the attached page.

Col 1, line 15, after "implemented" insert --by ion implanters, in which a surface is uniformly--.

Col. 3, line 49, after "embodiment" delete --,--.

Col. 3, line 51, after "ion beam" insert --,--.

Col. 4, lines 7 and 8, delete --substantially unipolar magnetic field having a magnitude--.

Col. 4, line 41, after "substantial" delete --the--.